United States Patent
Szocs et al.

(10) Patent No.: US 8,460,533 B2
(45) Date of Patent: Jun. 11, 2013

(54) INDIUM COMPOSITIONS

(75) Inventors: Edit Szocs, Lucerne (CH); Felix J. Schwager, Meggen (CH); Thomas Gaethke, Littau (CH); Nathaniel E. Brese, Farmingdale, NY (US); Michael P. Toben, Smithtown, NY (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 754 days.

(21) Appl. No.: 12/002,080

(22) Filed: Dec. 13, 2007

(65) Prior Publication Data

US 2011/0103022 A1    May 5, 2011

Related U.S. Application Data

(60) Provisional application No. 60/875,177, filed on Dec. 15, 2006.

(51) Int. Cl.
*C25D 3/00*      (2006.01)
*C23C 16/40*     (2006.01)

(52) U.S. Cl.
USPC ........................................ 205/261; 106/1.25

(58) Field of Classification Search
USPC .................................. 106/1.25; 205/238, 261
See application file for complete search history.

(56) References Cited

U.S. PATENT DOCUMENTS

| | | | |
|---|---|---|---|
| 3,389,060 A * | 6/1968 | Greene | 205/85 |
| 3,642,589 A * | 2/1972 | Nobel et al. | 205/242 |
| 3,812,020 A | 5/1974 | Vander | |
| 3,954,575 A | 5/1976 | Yanagida et al. | |
| 3,974,045 A | 8/1976 | Takahashi et al. | |
| 4,038,161 A | 7/1977 | Eckles et al. | |
| 4,617,096 A | 10/1986 | Kuhn et al. | |
| 4,626,324 A | 12/1986 | Samuels et al. | |
| 4,959,278 A | 9/1990 | Shimauchi et al. | |
| 5,607,570 A | 3/1997 | Rohbani | |
| 6,110,347 A | 8/2000 | Arao et al. | |
| 6,331,240 B1 | 12/2001 | Tsunoda et al. | |
| 6,406,677 B1 | 6/2002 | Carter et al. | |
| 6,610,192 B1 | 8/2003 | Step et al. | |
| 6,653,741 B2 | 11/2003 | Sreeram et al. | |
| 6,811,673 B2 | 11/2004 | Brodt et al. | |
| 2002/0175403 A1 | 11/2002 | Sreeram et al. | |
| 2003/0022477 A1 | 1/2003 | Hsieh et al. | |
| 2004/0217009 A1 * | 11/2004 | Mikkola et al. | 205/296 |
| 2005/0016858 A1 | 1/2005 | Barstad et al. | |

(Continued)

FOREIGN PATENT DOCUMENTS

| EP | 0 346 888 | 12/1989 |
|---|---|---|
| EP | 1 116 804 A2 | 7/2001 |

(Continued)

OTHER PUBLICATIONS

Walsh et al., "Electrode Reactions During the Electrodeposition of Indium from Acid Sulphate Solutions", Surface Technology (no month, 1978), vol. 6, pp. 425-436.*

(Continued)

*Primary Examiner* — Edna Wong
(74) *Attorney, Agent, or Firm* — John J. Piskorski

(57) ABSTRACT

Indium compositions including hydrogen suppressor compounds and methods of electrochemically depositing indium metal from the compositions onto substrates are disclosed. Articles made with the indium compositions are also disclosed.

7 Claims, 2 Drawing Sheets

U.S. PATENT DOCUMENTS

| | | |
|---|---|---|
| 2005/0040369 A1 | 2/2005 | Lalena et al. |
| 2005/0189231 A1* | 9/2005 | Capper et al. ............... 205/246 |
| 2006/0016693 A1* | 1/2006 | Wang et al. ............... 205/291 |
| 2006/0081475 A1 | 4/2006 | Barstad et al. |
| 2006/0220226 A1 | 10/2006 | Renavikar et al. |

FOREIGN PATENT DOCUMENTS

| | | |
|---|---|---|
| EP | 2 031 098 | 3/2009 |
| JP | 57-005857 A | 6/1980 |
| JP | 57-085987 A | 11/1980 |
| JP | 57-114653 A | 1/1981 |
| JP | 59-177357 A | 3/1983 |
| JP | 61-136697 A | 12/1984 |
| JP | 63-250486 A | 4/1987 |
| JP | 01-309992 A | 6/1988 |
| JP | 02-004978 A | 6/1988 |
| JP | 06-146058 A | 11/1992 |
| JP | 06-146059 A | 11/1992 |
| JP | 09-013190 | 6/1995 |
| JP | 09-176863 A | 11/1996 |
| JP | 11-279791 A | 3/1998 |
| JP | 2001-200387 A | 1/2000 |
| JP | 03-274766 | 4/2002 |

OTHER PUBLICATIONS

European Search Report corresponds with Europe Application 07 12 3162, Jun. 2009.

Deppish, et al, "The material optimization and reliability characterization of an indium-solder thermal interface material for CPU packaging," JOM, Jun. 2006, pp. 67-74.

Hua, et al, "Indium as thermal interface material for high power devices," Advancing Microelectronics, Jul./Aug. 2006, pp. 16-17.

DE 196 43 091—Abstract Only, Apr. 1998.

JP 57-203787A—Abstract Only, Dec. 1982.

* cited by examiner

INDIUM COMPOSITIONS

The present patent application claims the benefit of provisional patent application Ser. No. 60/875,177, filed Dec. 15, 2006.

The present invention is directed to indium compositions for electrochemical deposition of indium metal and indium alloys. More specifically, the present invention is directed to indium compositions including one or more hydrogen suppressing compounds for the electrochemical deposition of indium metal and indium alloys.

Electrochemical deposition of indium metal is challenging because indium metal deposition occurs simultaneously with hydrogen evolution from the electrolysis of water. The evolution of hydrogen compromises cathodic current efficiency resulting in low indium metal deposition rates as well as undesirable rough and powdery indium metal deposits or no indium deposits.

Indium, however, is a highly desirable metal in numerous industries because of its unique physical properties. For example, it is sufficiently soft such that it readily deforms and fills in microstructures between two mating parts, has a low melting temperature (156° C.) and a high thermal conductivity (~82 W/m° K). Such properties enable indium for various uses in the electronics and related industries.

For example, indium and its alloys may be used as thermal interface materials (TIMs). TIMs are critical to protect electronic devices such as integrated circuits (IC) and active semiconductor devices, for example, microprocessors, from exceeding their operational temperature limit. They enable bonding of the heat generating device (e.g. a silicon semiconductor) to a heat sink or a heat spreader (e.g. copper and aluminum components) without creating an excessive thermal barrier. The TIM may also be used in the assembly of other components of the heat sink or the heat spreader stack that composes the overall thermal impedance path.

Formation of an efficient thermal path is an important property of TIMs. The thermal path can be described in terms of effective thermal conductivity through the TIM. The effective thermal conductivity of the TIM is primarily due to the integrity of the interface between the TIMs and the heat spreader thermal conductivity as well as the (intrinsic) bulk thermal conductivity of the TIM. A variety of other properties are also important for a TIM depending on the particular application, for example: an ability to relax thermal expansion stresses when joining two materials (also referred to as "compliance"), an ability to form a mechanically sound joint that is stable during thermal cycling, a lack of sensitivity to moisture and temperature changes, manufacturing feasibility and cost.

Several classes of materials are being used as TIMs, for example, thermal greases, thermal gels, adhesives, elastomers, thermal pads, and phase change materials. Although the foregoing TIMs have been adequate for many semiconductor devices, the increased performance of semiconductor devices has rendered such TIMs inadequate. Thermal conductivity of many current TIMs does not exceed 5 W/m° K and many are less than 1 W/m° K. However, TIMs that form thermal interfaces with effective thermal conductivities exceeding 15 W/m° K are presently needed.

An alternative to the foregoing TIMs are metals, solders and their alloys which have low melting temperatures and that have high thermal conductivities. Metal TIMs such as indium may also exhibit a favorable solder or wetting behavior upon reflow which facilitates a low thermal interfacial resistance. During reflow the solder and substrate are heated, the solder melts and wets by surface tension and local surface alloying. The interfaces consist of intermetallics or interdiffused metals with thermal properties that are frequently less desirable than those of the bulk TIM metal but better than polymer based TIMs. In many cases metallic TIMs are subjected to reflow in order to form reliable thermal interfaces. Metallic TIMs, however, can fail in certain applications due to the relatively large differences between the coefficients of thermal expansion (CTEs) of the TIM and the semiconductor and heat sink components and lack of compliance. Indium metal has at least the low melting point and thermal conductivity highly desired for use as a TIM.

An example of indium for a TIM is disclosed in U.S. Pat. No. 6,653,741 to Sreeram et al. The indium is used as a binder material for a solder. The solder material described in Sreeram is not suitable for plating because the intrinsic oxygen getter components are generally incompatible with aqueous plating. Further, solder pastes generally contain high levels of contaminants which can degrade the thermal performance of solder-based TIMs.

Another example of the use of indium is as a top layer and as an underlayer to prevent the formation of whiskers from tin and tin alloys in electrical devices. This is disclosed in U.S. Pat. No. 4,959,278 to Shimauchi et al. Whiskers may lead to shorts in electrical devices thus resulting in the malfunctioning of the devices. Whisker formation typically occurs at points of stress and strain in metal components such as, but not limited to, lead frames. When the shape of a metal component is modified to mechanically and electrically contact another component of an electrical apparatus, the points of stress or strain may form metal crystals or whiskers of tin, tin alloy or another metal. Accordingly, indium is a highly desirable metal for electronic devices, and there is a need for an improved indium composition for the electrochemical deposition of indium metal and its alloys.

In one aspect compositions include one or more sources of indium ions and one or more epihalohydrin copolymers.

In another aspect methods include providing a composition including one or more sources of indium ions and one or more epihalohydrin copolymers; and electrochemically depositing indium on a substrate.

In a further aspect articles include a die joined on a first side to a base, a second side of the die opposite the first side comprises a thermal interface material consisting of indium or its alloys.

The indium compositions are stable and provide indium metal and indium alloy deposits which are compact, i.e. no pores, smooth, a uniform thickness distribution and few, if any, edge defects, i.e. thick deposit build up at the plated substrate sides. Epihalohydrin copolymers suppress the formation of hydrogen gas during indium metal and indium alloy deposition thus enabling the formation of the desired indium metal and indium alloy deposits. Because indium metal has a low melting point and a high thermal conductivity, indium metal is highly suitable for use as thermal interface material in many electrical devices. Further, indium metal dissipates strain induced by CTE mismatch of two mating materials at interfaces, which also makes it desirable for use as a TIM. In addition, the indium metal and indium alloys electrochemically deposited from the indium compositions may be used as an underlayer to prevent or inhibit the formation of whiskers. The indium metal and indium metal alloys electrochemically deposited from the indium compositions may also be used as solder bumps to provide electrical connections.

Figure 1:
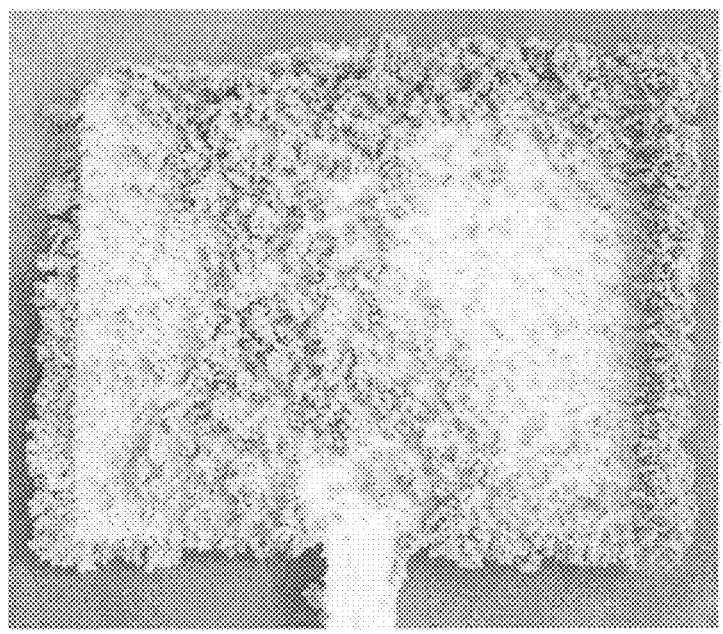
FIG. 1 is a photograph of indium electroplated on a substrate from an indium electrolyte with low efficiency.

As used throughout the specification, the following abbreviations have the following meanings, unless the context clearly indicates otherwise: ° C.=degrees Centigrade; ° K=degrees Kelvin; GPa=giga pascal; g=gram; mg=milligram; L=liter; m=meter; A=amperes; dm=decimeter; μm=micron=micrometer; ppm=parts per million; ppb=parts per billion; mm=millimeter; M=molar; MEMS=micro-electro-mechanical systems; TIM=thermal interface material; CTE=coefficient of thermal expansion; IC=integrated circuits and EO=ethylene oxide.

The terms "depositing" and "plating" are used interchangeably throughout this specification. The term "underlayer", as used throughout this specification, refers to a metal layer or coating disposed between a substrate and a tin or tin alloy layer or other suitable metal or metal alloy layer. The term "copolymer" is a compound composed of two or more different mers. All amounts are percent by weight and all ratios are by weight, unless otherwise noted. All numerical ranges are inclusive and combinable in any order except where it is logical that such numerical ranges are constrained to add up to 100%.

The compositions include one or more sources of indium ions which are soluble in an aqueous environment. Such sources include, but are not limited to, indium salts of alkane sulfonic acids and aromatic sulfonic acids, such as methanesulfonic acid, ethanesulfonic acid, butane sulfonic acid, benzenesulfonic acid and toluenesulfonic acid, salts of sulfamic acid, sulfate salts, chloride and bromide salts of indium, nitrate salts, hydroxide salts, indium oxides, fluoroborate salts, indium salts of carboxylic acids, such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, hydroxybutyric acid, indium salts of amino acids, such as arginine, aspartic acid, asparagine, glutamic acid, glycine, glutamine, leucine, lysine, threonine, isoleucine, and valine. Typically, the source of indium ions is one or more indium salts of sulfuric acid, sulfamic acid, alkane sulfonic acids, aromatic sulfonic acids and carboxylic acids. More typically, the source of indium ions is one or more indium salts of sulfuric acid and sulfamic acid.

The water-soluble salts of indium are included in the compositions in sufficient amounts to provide an indium deposit of the desired thickness. Typically the water-soluble indium salts are included in the compositions to provide indium $(3^+)$ ions in the compositions in amounts of 5 g/L to 70 g/L, or such as from 10 g/L to 60 g/L, or such as from 15 g/l to 30 g/L.

Buffers or conducting salts included in the indium compositions may be one or more acids to provide a pH of 0 to 5, typically a pH of 0.5 to 3, more typically 1 to 1.5. Such acids include, but are not limited to, alkane sulfonic acids, aryl sulfonic acids, such as methanesulfonic acid, ethanesulfonic acid, benzenesulfonic acid, toluenesulfonic acid, sulfamic acid, sulfuric acid, hydrochloric acid, hydrobromic acid, fluoroboric acid, boric acid, carboxylic acids such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, and hydroxybutyric acid, amino acids, such as arginine, aspartic acid, asparagine, glutamic acid, glycine, glutamine, leucine, lysine, threonine, isoleucine and valine. One or more corresponding salts of the acids also may be used. Typically, one or more alkane sulfonic acids, aryl sulfonic acids and carboxylic acids are used as buffers or conducting salts. More typically, one or more alkane sulfonic acids and aryl sulfonic acids or their corresponding salts are used.

Buffers or conducting salts are used in sufficient amounts to provide the desired pH of the compositions. Typically, the buffers or conducting salts are used in amounts of 5 g/L to 50 g/L, or such as from 10 g/L to 40 g/L, or such as from 15 g/L to 30 g/L of the compositions.

One or more hydrogen suppressors are included in the indium compositions to suppress hydrogen gas formation during indium metal deposition. Hydrogen suppressors are compounds which drive the potential for water decomposition, the source of hydrogen gas, to a more cathodic potential such that indium metal may deposit without the simultaneous evolution of hydrogen gas. This increases the current efficiency for indium deposition at the cathode and enables formation of indium layers which are smooth and uniform in appearance and also permits the formation of thicker indium layers than many conventional indium electrochemical baths. This process may be shown using cyclic voltammetry (CV) investigation well known in the art and literature. Typically, aqueous indium electrochemical baths which do not include one or more hydrogen suppressors form indium deposits that are rough and uneven in appearance. Such deposits are unsuitable for use in electronic devices. Often no indium deposits are formed from such baths.

The hydrogen suppressors are epihalohydrin copolymers. Epihalohydrins include epichlorohydrin and epibromohydrin. Typically, copolymers of epichlorohydrin are used. Such copolymers are water-soluble polymerization products of epichlorohydrin or epibromohydrin and one or more organic compounds which includes nitrogen, sulfur, oxygen atoms or combinations thereof.

Nitrogen-containing organic compounds copolymerizable with epihalohydrins include, but are not limited to:
1) aliphatic chain amines;
2) unsubstituted heterocyclic nitrogen compounds having at least two reactive nitrogen sites; and,
3) substituted heterocyclic nitrogen compounds having at least two reactive nitrogen sites and having 1-2 substitution groups chosen from alkyl groups, aryl groups, nitro groups, halogens and amino groups.

Aliphatic chain amines include, but are not limited to, dimethylamine, ethylamine, methylamine, diethylamine, triethyl amine, ethylene diamine, diethylenetriamine, propylamine, butylamine, pentylamine, hexylamine, heptylamine, octylamine, 2-ethylhexylamine, isooctylamine, nonylamine, isononylamine, decylamine, undecylamine, dodecylaminetridecylamine and alkanol amines.

Unsubstituted heterocyclic nitrogen compounds having at least two reactive nitrogen sites include, but are not limited to, imidazole, imidazoline, pyrazole, 1,2,3-triazole, tetrazole, pyradazine, 1,2,4-triazole, 1,2,3-oxadiazole, 1,2,4-thiadiazole and 1,3,4-thiadiazole.

Substituted heterocyclic nitrogen compounds having at least two reactive nitrogen sites and having 1-2 substitutions groups include, but are not limited to, benzimidazole, 1-methylimidazole, 2-methylimidazole, 1,3-diemthylimidazole, 4-hydroxy-2-amino imidazole, 5-ethyl-4-hydroxyimidazole, 2-phenylimidazoline and 2-tolylimidazoline.

Typically, one or more compounds chosen from imidazole, pyrazole, imidazoline, 1,2,3-triazole, tetrazole, pyridazine, 1,2,4-triazole, 1,2,3-oxadiazole, 1,2,4-thiadiazole and 1,3,4-thiadiazole and derivatives thereof which incorporate 1 or 2 substituents chosen from methyl, ethyl, phenyl and amino groups are used to form the epihalohydrin copolymer.

Some of the epihalohydrin copolymers are commercially available such as from Raschig GmbH, Ludwigshafen Germany and from BASF, Wyandotte, Mich., USA, or may be made by methods disclosed in the literature. An example of a commercially available imidazole/epichlorohydrin copolymer is Lugalvan™ IZE, obtainable from BASF.

Epihalohydrin copolymers may be formed by reacting epihalohydrins with the nitrogen, sulfur or oxygen containing compounds described above under any suitable reaction conditions. For example, in one method, both materials are dissolved in suitable concentrations in a body of mutual solvent and reacted therein at, for example, 45 to 240 minutes. The aqueous solution chemical product of the reaction is isolated by distilling off the solvent and then is added to the body of water which serves as the electroplating solution, once the indium salt is dissolved. In another method these two materials are placed in water and heated to 60° C. with constant vigorous stirring until they dissolve in the water as they react.

A wide range of ratios of the reaction compound to epihalohydrin can be used, such as from 0.5:1 to 2:1. Typically the ratio is from 0.6:1 to 2:1, more typically the ratio is 0.7 to 1:1, most typically the ratio is 1:1.

Additionally, the reaction product may be further reacted with one or more reagents before the electroplating composition is completed by the addition of indium salt. Thus, the described product may be further reacted with a reagent which is at least one of ammonia, aliphatic amine, polyamine and polyimine. Typically, the reagent is at least one of ammonia, ethylenediamine, tetraethylene pentamine and a polyethyleneimine having a molecular weight of at least 150, although other species meeting the definitions set forth herein may be used. The reaction can take place in water with stirring.

For example, the reaction between the reaction product of epichlorohydrin and a nitrogen-containing organic compound as described above and a reagent chosen from one or more of ammonia, aliphatic amine, and arylamine or polyimine can take place and can be carried out at a temperature of, for example, 30° C. to 60° C. for, example, 45 to 240 minutes. The molar ratio between the reaction product of the nitrogen containing compound-epichlorohydrin reaction and the reagent is typically 1:0.3-1.

The epihalohydrin copolymers are included in the compositions in amounts of 5 g/L to 100 g/L. Typically, epihalohydrin copolymers are included in amounts of 10 g/L to 80 g/L, more typically, they are included in amounts of 20 g/L to 70 g/L, most typically in amounts of 30 g/L to 60 g/L.

Optional additives also may be included in the compositions to tailor the compositions to electroplating conditions and to a substrate. Such optional additives include, but are not limited to, one or more of surfactants, chelating agents, levelers, suppressors (carriers), one or more alloying metals and other conventional additives used in indium electrochemical formulations.

Any surfactant which is compatible with the other components of the compositions may be used. Typically, the surfactants are reduced foaming or non-foaming surfactants. Such surfactants include, but are not limited to, non-ionic surfactants such as ethoxylated polystyrenated phenol containing 12 moles of EO, ethoxylated butanol containing 5 moles of EO, ethoxylated butanol containing 16 moles of EO, ethoxylated butanol containing 8 moles of EO, ethoxylated octanol containing 12 moles of EO, ethoxylated octylphenol containing 12 moles of EO, ethoxylated/propoxylated butanol, ethoxylated beta-naphthol containing 13 moles of EO, ethoxylated beta-naphthol containing 10 moles of EO, ethoxylated bisphenol A containing 10 moles of EO, ethoxylated bisphenol A containing 13 moles of EO, sulfated ethoxylated bisphenol A containing 30 moles of EO and ethoxylated bisphenol A containing 8 moles of EO. Such surfactants are included in conventional amounts. Typically, they are included in the compositions in amounts of 0.1 g/L to 20 g/l, or such as from 0.5 g/L to 10 g/L. They are commercially available and may be prepared from methods disclosed in the literature.

Other surfactants include, but are not limited to, amphoteric surfactants such as alkyldiethylenetriamine acetic acid and quaternary ammonium compounds and amines. Such surfactants are well known in the art and many are commercially available. They may be used in conventional amounts. Typically they are included in the compositions in amounts of 0.1 g/L to 20 g/L, or such as from 0.5 g/L to 10 g/L. Typically, the surfactants used are quaternary ammonium compounds.

Chelating agents include, but are not limited to, carboxylic acids, such as malonic acid and tartaric acid, hydroxy carboxylic acids, such as citric acid and malic acid and salts thereof. Stronger chelating agents, such as ethylenediamine tetraacetic acid (EDTA) also may be used. The chelating agents may be used alone or combinations of the chelating agents may be used. For example, varying amounts of a relatively strong chelating agent, such as EDTA can be used in combination with varying amounts of one or more weaker chelating agents such as malonic acid, citric acid, malic acid and tartaric acid to control the amount of indium which is available for electroplating. Chelating agents may be used in conventional amounts. Typically, chelating agents are used in amounts of 0.001M to 3M.

Levelers include, but are not limited to, polyalkylene glycol ethers. Such ethers include, but are not limited to, dimethyl polyethylene glycol ether, di-tertiary butyl polyethylene glycol ether, polyethylene/polypropylene dimethyl ether (mixed or block copolymers), and octyl monomethyl polyalkylene ether (mixed or block copolymer). Such levelers are included in conventional amounts. Typically such levelers are included in amounts of 100 ppb to 500 ppb.

Suppressors include, but are not limited to, phenanthroline and its derivatives, such as 1,10-phenantroline, triethanolamine and its derivatives, such as triethanolamine lauryl sulfate, sodium lauryl sulfate and ethoxylated ammonium lauryl sulfate, polyethyleneimine and its derivatives, such as hydroxypropylpolyeneimine (HPPEI-200), and alkoxylated polymers. Such suppressors are included in the indium compositions in conventional amounts. Typically, suppressors are included in amounts of 200 ppm to 2000 ppm.

One or more alloying metals include, but are not limited to, aluminum, bismuth, cerium, copper, gold, magnesium, silver, tin, titanium, zirconium and zinc. Typically the alloying metals are silver, bismuth and tin. The alloying metals may be added to the indium compositions as water soluble metal salts. Such water soluble metal salts are well known. Many are commercially available or may be prepared from descriptions in the literature. Water soluble metal salts are added to the indium compositions in amounts sufficient to form an indium alloy having 1 wt % to 5 wt %, or such as from 2 wt % to 4 wt % of an alloying metal. Typically, water soluble metal salts are added to the indium compositions in amounts such that the indium alloy has from 1 wt % to 3 wt % of an alloying metal.

Adding one or more alloying metals to indium may alter the properties of indium. Quantities of alloying metals in amounts of 3 wt % or less can improve TIM high temperature corrosion resistance and wetting and bonding to substrates such as silicon chips. Additionally, alloying metals such as silver, bismuth and tin can form low melting point eutectics with indium. Alloying metals may be included in the indium compositions in amounts of 0.01 g/L to 15 g/L, or such as 0.1 g/L to 10 g/L, or such as 1 g/L to 5 g/L.

The indium compositions may be used to deposit indium metal or indium alloy layers on a substrate. The purity of the indium metal deposit may be as high as 99% by weight or higher unless an alloying metal is included. Layer thickness varies depending on the function of the indium metal or indium alloy layer. In general thicknesses may range from 0.1 µm or more, or such as from 1 µm to 400 µm, or such as from 10 µm to 300 µm, or such as from 20 µm to 250 µm, or such as from 50 µm to 200 µm. Typically, indium metal and indium alloy layers range from 150 µm to 200 µm.

Apparatus used to deposit indium metal and indium alloys on a substrate is conventional. Conventional electrodes may be used. Typically, soluble electrodes are used. More typically, soluble indium electrodes are used as anodes. The substrate to be plated with the indium metal is the cathode or working electrode. Any suitable reference electrode may be used, if required. Typically, the reference electrode is a silver chloride/silver electrode. Current densities may range from 0.5 A/dm$^2$ to 30 A/dm$^2$, or such as from 1 A/dm$^2$ to 25 A/dm$^2$, or such as from 10 A/dm$^2$ to 20 A/dm$^2$.

The temperatures of the indium compositions during indium metal electrolytic deposition range from 30° C. to 80° C. Typically, the temperatures range from 40° C. to 80° C.

The indium compositions may be used to deposit indium metal or indium alloys on various substrates, including components for electronic devices, for magnetic field devices and superconductivity MRIs. The indium compositions may also be used with conventional photoimaging methods to electrochemically deposit indium metal or indium alloy solder bumps on various substrates such as silicon or GaAs wafers.

For example, the indium compositions may be used to electrochemically deposit indium metal or an indium alloy on a component for an electrical device to function as a TIM, such as for, but not limited to, ICs, microprocessors of semiconductor devices, MEMS and components for optoelectronic devices. Such electronic components may be included in printed wiring boards and hermetically sealed chip-scale and wafer-level packages. Such packages typically include an enclosed volume which is hermetically sealed, formed between a base substrate and lid, with the electronic device being disposed in the enclosed volume. The packages provide for containment and protection of the enclosed device from contamination and water vapor in the atmosphere outside the package. The presence of contamination and water vapor in the package can give rise to problems such as corrosion of metal parts as well as optical losses in the case of optoelectronic devices and other optical components. The low melting temperature (156° C.) and high thermal conductivity (~82 W/m° K) are properties which make indium metal highly desirable for use as a TIM.

Indium TIMs remove heat from processing dies (i.e. resin enclosed silicon chips) and transfer the heat to lid/heat sinks. The indium TIMs also take up stress induced by the mismatch of the CTE between different materials which are joined together in electronic devices. Indium has a coefficient of thermal expansion of 29 ppm/° C., while silicon and copper are 3 and 17, respectively. The modulus of indium is 10 GPa, while those of the harder silicon and copper are 50 and 130, respectively.

In one embodiment an indium metal or indium alloy layer is electrochemically deposited on a surface of a processing die substrate to function as a TIM and a heat sink is joined to the processing die by means of the indium metal or alloy layer. The heat sink may be of a conventional material such as nickel coated copper, silicon carbide or aluminum. The processing die may be joined to a printed wiring board base or ceramic base by means of solder bumps, which are on a side of the processing die opposite to that of the indium metal or alloy layer. The solder bumps may be composed of conventional materials such as tin or tin alloys or other conventional materials used in the electronics industry. The solder bumps also may be of electrochemically deposited indium metal or indium alloy from the compositions described above.

In another embodiment an indium metal or alloy layer is electrochemically deposited on a surface of a processing die substrate to function as a TIM and a concave lid (i.e. a top portion with continuous sides perpendicular to the top portion) which covers the processing die and is placed over the die and indium metal or alloy layer. The lid may have a conventional design (i.e. rectangular or elliptical) and may be of conventional materials, such as copper or copper alloy. The indium or alloy layer joins the lid to the die. The processing die is joined to a printed wiring board base or ceramic base by means of solder bumps. Solder bumps at bottom surfaces of the sides of the concave lid join the lid to the printed wiring board base or ceramic base.

In another embodiment an indium metal or indium alloy layer is electrochemically deposited on a surface of a heat spreader to function as a TIM. The heat spreader and lid may be of conventional materials, such as copper, copper alloys, silicon carbide or composites of metals and ceramics, such as aluminum infused silicon carbide. The indium metal or indium alloy layer joins the lid to the die.

In a further embodiment an indium metal layer is electrochemically deposited on a surface of a processing die substrate to function as a TIM and a concave lid (i.e. a top portion with continuous sides perpendicular to the top portion) which covers the processing die and is placed over the die and indium metal layer. The lid may have a conventional design (i.e. rectangular or elliptical) and may be of conventional materials. The indium layer joins the lid to the die. The processing die is joined to a printed wiring board base or ceramic base by means of solder bumps. Solder bumps at bottom surfaces of the sides of the concave lid join the lid to the printed wiring board base or ceramic base. A second indium metal layer is electrochemically deposited on the top of the lid to function as a second TIM and a heat sink is joined to the top of the lid by means of the second indium metal layer.

In addition to depositing indium and indium alloys on the processing die substrate and heat spreader, indium and indium alloys may be deposited on the lid.

The thickness of the indium metal or alloy layers for TIMs may vary. Typically, the layers are 230 µm or less. More typically, the layers range from 50 µm to 230 µm or such as from 100 µm to 220 µm or such as from 140 µm to 210 µm.

In addition to TIMs, the indium compositions may be used to electrochemically deposit underlayers on substrates to prevent whisker formation in electronic devices. The substrates include, but are not limited to, electrical or electronic components or parts such as film carriers for mounting semiconductor chips, printed circuit boards, lead frames, contacting elements such as contacts or terminals and plated structural members which demand good appearance and high operation reliability.

Indium metal may be used as an underlayer for tin or tin alloy top layers to prevent or inhibit the formation of whiskers. Whiskers often form when tin or tin alloy layers are deposited on metal materials, such as copper or copper alloys, which compose electrical or electronic components. Whiskers are known to cause electrical shorts resulting in the malfunction of electrical devices. Further, dissipation of strain of CTE mismatch between indium and other metals at the interfaces improves adhesion between the metal layers. Typically, indium underlayers have a thickness of 0.1 μm to 10 μm or such as from 0.5 μm to 5 μm. The tin or tin alloy layers are of conventional thickness.

The following examples further illustrate the invention, but are not intended to limit the scope of the invention.

Example I

Comparative

The following aqueous indium electrochemical composition was prepared:

TABLE 1

| COMPONENT | AMOUNT |
|---|---|
| Indium (3+) ions (from indium sulfate) | 30 g/L |
| Ammonium hydroxide | 170 g/L |
| Boric acid | 80 g/L |
| Tataric acid | 300 g/L |
| Conventional indium electroplating bath additives | 0.5 g/L |
| Water | To desired volume |
| pH | 3 |

The apparatus for electrochemically depositing indium metal was a conventional commercially available electrolytic cell.

The indium electrochemical composition was maintained at a pH of 3 and a temperature of 60° C. The composition was continuously agitated during indium metal electroplating. Cathode current density was maintained at 10 A/dm², and indium deposition rate was 1 μm over 20 seconds (23 mg/A).

FIG. 1 shows a photograph of the indium metal coated working electrode with a cathode efficiency of less than 60%. The photograph was taken with a conventional 35 mm lens camera. As shown in the photograph the deposit was spongy in appearance and had a non-uniform deposit of indium metal. Such deposits are unsuitable for components in electronic devices, such as TIMs and underlayers. The spongy and non-uniform surface may result in inefficient heat transfer and electrical current in electrical devices causing malfunction of the devices. The spongy and non-uniform surface was believed to be caused by the evolution of hydrogen gas during indium metal deposition and the decomposition of organic additives in the indium composition.

Example II

The following aqueous indium electrochemical composition was prepared:

TABLE 2

| COMPONENT | AMOUNT |
|---|---|
| Indium (3+) ions (from indium sulfate) | 60 g/L |
| Methane sulfonic acid | 30 g/L |
| Imidazole-epichlorohydrin copolymer[1] | 100 g/L |
| Water | To the desired volume |
| pH | 1-1.2 |

[1]Lugalvan ™ IZE, obtainable from BASF. (IZE contains 48-50 wt % copolymer)

The apparatus for electroplating indium metal was a conventional commercially available electrolytic cell.

The pH of the indium electroplating composition was maintained from 1 to 1.2 during indium metal deposition. The temperature of the composition was maintained at 60° C. during electroplating. The electroplating composition was continuously agitated during indium metal deposition. Throughout the electroplating period the current density was maintained at 10 A/dm² with 1 μm of indium metal deposited on the working electrode over 20 seconds (23 mg/A). The indium composition remained stable, i.e. no visible turbidity, during electroplating. Indium metal deposition continued until an indium metal layer of 200 μm was deposited on the working electrode.

Figure 2:
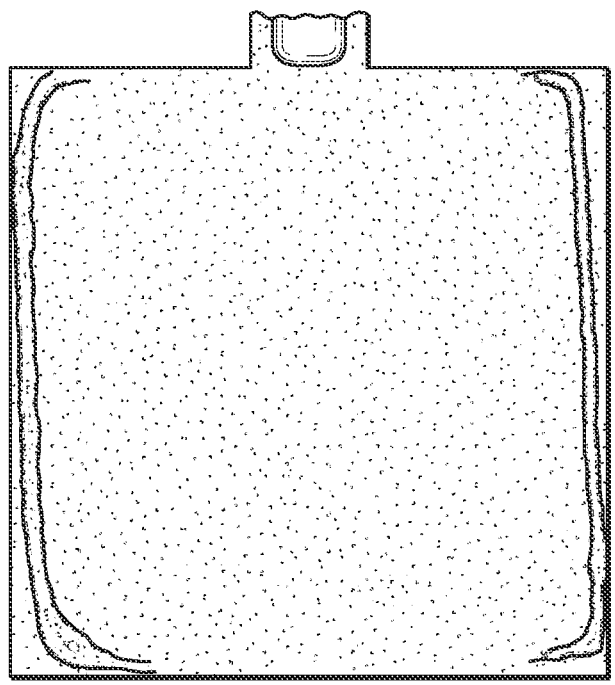
FIG. 2 is a photograph of indium electroplated on a substrate from an indium electrolyte composition of the invention.

FIG. 2 shows a photograph of the indium metal coated working electrode. As shown in the photograph the indium metal deposit was smooth in appearance and the deposit was uniform. Accordingly, the indium electrochemical composition with the imidazole-epichlorohydrin copolymer had an improved indium metal deposit in contrast to the comparative indium composition.

Such smooth and uniform deposits are highly desirable for components in electronic devices, such as TIMs and underlayers. The smooth and uniform surface enables efficient heat transfer from processor dies to heat sinks when the indium is used as a TIM.

Example III

The method described in Example II above is repeated except that the epihalohydrin copolymer is an imidazoline-epichlorohydrin copolymer prepared by conventional methods known in the art. The indium composition which includes the imidazoline-epichlorohydrin copolymer is expected to inhibit hydrogen gas formation during indium electroplating and to deposit a smooth and uniform indium metal layer on a working electrode as shown in FIG. 2. An indium underlayer deposited from this composition is also expected to prevent or at least inhibit the formation of whiskers after a period of at least one month storage at a temperature of 40° C. or greater and at least 95% relative humidity.

Example IV

The method described in Example II above is repeated except that the epihalohydrin copolymer is a 1,2,3-triazole-epichlorohydrin copolymer prepared by conventional methods known in the art. The indium composition which includes the 1,2,3-triazole-epichlorohydrin copolymer is expected to inhibit hydrogen gas formation during indium electroplating and to deposit a smooth and uniform indium metal layer on a working electrode as shown in FIG. 2. An indium underlayer deposited from this composition is also expected to prevent or at least inhibit the formation of whiskers after a period of at least one month of storage at a temperature of 40° C. or greater and at least 95% relative humidity.

Example V

The method described in Example II above is repeated except that the epihalohydrin copolymer is a pyridazine-epibromohydrin copolymer prepared by conventional methods known in the art. The indium composition which includes the pyridazine-epibromohydrin copolymer is expected to inhibit hydrogen gas formation during indium electroplating and to deposit a smooth and uniform indium metal layer on a working electrode as shown in FIG. 2. An indium underlayer deposited from this composition is also expected to prevent or at least inhibit the formation of whiskers after a period of at least one month storage at a temperature of 40° C. or greater and at least 95% relative humidity.

Example VI

The method described in Example II above is repeated except that the epihalohydrin copolymer is a 2-methylimidazole-epibromohydrin copolymer prepared by conventional methods known in the art. The indium composition which includes the 2-methylimidazole-epibromohydrin copolymer is expected to inhibit hydrogen gas formation during indium electroplating and to deposit a smooth and uniform indium metal layer on a working electrode as shown in FIG. 2. An indium underlayer deposited from this composition is also expected to prevent or at least inhibit the formation of whiskers after a period of at least one month storage at a temperature of 40° C. or greater and at least 95% relative humidity.

Example VII

The method in Example II above is repeated except the indium electrochemical composition further includes 2 wt % tin sulfate. The current density is maintained at 10 A/dm$^2$ over 30 seconds and an indium/tin metal alloy is deposited on the indium electrode. The electrochemical composition is expected to remain stable during electroplating and no detectable hydrogen evolution is expected during deposition by cyclic voltammetry analysis. The indium/tin alloy layer is expected to be smooth and uniform in appearance.

Example VIII

The method in Example II is repeated except that the indium electrochemical composition further includes 2 wt % of zinc sulfate. The current density is maintained at 10 A/dm$^2$ over 20 minutes and an indium/zinc metal alloy is deposited on the indium electrode. The electrochemical composition is expected to be stable and no detectable hydrogen gas evolution is expected during alloy deposition by cyclic voltammetry analysis. The indium/zinc alloy layer is expected to be smooth and uniform in appearance.

Example IX

The method in Example II is repeated except that the indium electrochemical composition further includes 1 wt % of copper sulfate pentahydrate. The current density is maintained at 5 A/dm$^2$ over 40 minutes and an indium/copper metal alloy is deposited on the indium electrode. The electrochemical composition is expected to be stable and no detectable hydrogen gas evolution is expected during alloy deposition by cyclic voltammetry analysis. The indium/copper alloy layer is expected to be smooth and uniform in appearance.

What is claimed is:

1. An indium metal plating composition consisting of one or more sources of indium ions in amounts of 10 g/L to 70 g/L; one or more acids or salts thereof; one or more hydrogen suppressing epihalohydrin copolymers, the one or more hydrogen suppressing epihalohydrin copolymers are composed of an epihalohydrin and one or more nitrogen-containing organic compounds; optionally, one or more additives selected from the group consisting of surfactants, chelating agents, levelers and suppressors; and water.

2. The indium metal plating composition of claim 1, wherein the one or more nitrogen-containing compounds are chosen from imidazole, derivatives of imidazole, imidazoline and derivatives of imidazoline.

3. The indium metal plating composition of claim 1, wherein the one or more sources of indium ions are in amounts of 10 g/L to 60 g/L.

4. The indium metal plating composition of claim 1, wherein the one or more acids or salts thereof are chosen from alkane sulfonic acids, aryl sulfonic acids, sulfamic acid, sulfuric acid, carboxylic acids and amino acids.

5. The indium metal plating composition of claim 1, wherein the one or more acids or salts thereof are in amounts of 5 g/l to 50 g/l.

6. The indium metal plating composition of claim 1, wherein a pH is 0 to 5.

7. The indium metal plating composition of claim 6, wherein the pH is 0.5 to 3.

\* \* \* \* \*